United States Patent [19]
Sechi

[11] 3,996,524
[45] Dec. 7, 1976

[54] LINEAR AMPLIFIER UTILIZING ADAPTIVE BIASING

[75] Inventor: Franco Nicola Sechi, Lawrenceville, N.J.

[73] Assignee: RCA Corporation, New York, N.Y.

[22] Filed: Nov. 5, 1975

[21] Appl. No.: 629,088

[52] U.S. Cl. .................................. 330/35; 330/40
[51] Int. Cl.² .......................................... H03F 3/16
[58] Field of Search ................. 330/18, 22, 29, 40, 330/149, 35; 332/37 R, 37 D

[56] References Cited
UNITED STATES PATENTS 3,426,290  2/1969  Jensen ................................. 330/40
3,443,241  5/1969  Pitzalis .............................. 330/29

*Primary Examiner*—James B. Mullins
*Attorney, Agent, or Firm*—E. J. Norton; J. D. Lazar; M. A. Lechter

[57] ABSTRACT

A linear amplifier for an amplitude modulated RF input signal wherein the DC output-port bias voltage is varied in accordance with the current into the DC output-port to prevent amplitude and phase distortion of the output signal. Amplifiers utilizing bipolar and field effect transistors are disclosed.

4 Claims, 4 Drawing Figures

1

LINEAR AMPLIFIER UTILIZING ADAPTIVE BIASING

CROSS REFERENCE TO RELATED APPLICATIONS

Of interest is copending application Ser. No. 591,954 entitled "Linear High Power Transistor Amplifier" filed June 30, 1975 by the present inventor and assigned to the same assignee as the present invention.

BACKGROUND OF THE INVENTION

1. Field of the Invention

The present invention is directed to linear radio frequency (RF) amplifiers.

2. Description of the Prior Art

Linear high-power amplifiers for amplitude-modulated RF signals are required in a number of telecommunication applications. Satellite telecommunication systems have typically utilized traveling wave tube (TWT) amplifiers. It is desirable, however, to replace such TWT amplifiers with solid state transistor amplifiers in that transistor amplifiers are typically lighter, less bulky, less expensive, and more reliable.

Attempts to replace TWT amplifiers with transistor amplifiers have historically failed; the efficiency of class A transistor amplifiers is unacceptably low and high efficiency class B or class AB transistor amplifiers have typically been unable to maintain a linear response over a spectrum of modulation frequencies which is comparable to the bandwidth of TWT amplifiers. Copending application Ser. No. 591,954 by the present inventor discloses a linear high-power transistor amplifier wherein linearity of response is maintained over a broad band of modulation frequencies by use of active biasing circuits. Experimental measurements have shown such broad-band linear transistor amplifiers to be in the order of three times as efficient as TWT amplifiers in environments requiring high carrier-to-intermdoulation signal amplitude ratios. However, classes B or AB transistor amplifiers have typically been further limited in application because of the occurrence of output signal amplitude and phase distortion when high amplitude input signals are applied to the amplifier. Amplitude and phase distortion are respectively defined as the change of the amplifier gain and change of the relative phase between input and output signals in response to variations in the amplitude of the input signal. Such amplitude and phase distortions are caused, in transistor amplifiers, respectively, by saturation of the transistors, and the varactor-like inter-electrode capacitance of RF transistors.

SUMMARY OF THE INVENTION

The present invention is directed to a class B or class AB linear transistor amplifier utilizing adaptive biasing whereby the DC output-port bias voltage is varied in accordance with the current into the DC output-port, to eliminate substantially such amplitude and phase distortions.

DETAILED DESCRIPTION OF A PREFERRED EMBODIMENT

Figure 1:
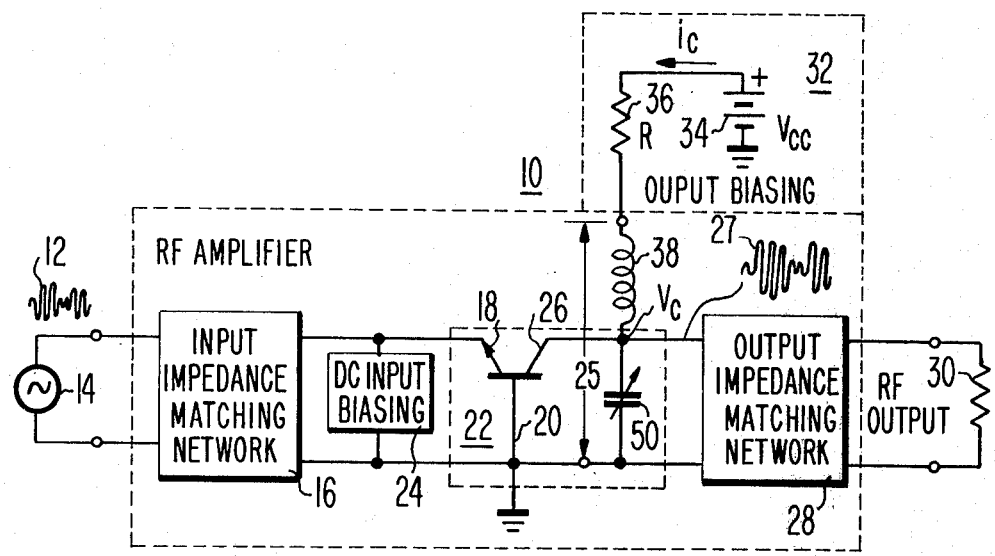
FIG. 1 is a schematic diagram of a prior art class B RF amplifier.

A prior art class B (or AB) transistor amplifier circuit 10 is depicted in FIG. 1. An amplitude modulated input signal 12 is supplied by a RF source 14, through a suitable input impedance matching network 16, coupled across the emitter 18 and base 20 of an NPN transistor 22. Transistor 22 may be, either of the NPN or PNP type transistor or a field effect transistor (FET). Also coupled across emitter 18 and base 20 of transistor 22 is a suitable DC input biasing network 24, preferably an active biasing network of the type described in the above-mentioned copending application Ser. No. 591,954. Such input biasing network 24, may include a linearization resistor to "mask" any non-linearities and frequency-related variations in the emitter-to-base impedance of transistor 22. Transistor 22 generates, across its collector 26 and base 20, an amplified RF signal 27, which is applied through suitable output impedance matching network 28 to a load 30. The base 20 of transistor 22 is connected to ground. Such configuration is known in the art as a common base amplifier. Collector-base biasing, hereinafter referred to as output biasing, is supplied by an output biasing circuit 32. Output biasing circuit 32, in the prior art, has typically been a DC power source. Such a DC power source has an equivalent circuit comprising a voltage source 34 of voltage $V_{cc}$ and a source resistance 36 of value R. Biasing network 32 is connected, through an RF choke 38, across collector 26 and base 20. The port consisting of base 20 and the juncture between output biasing circuit 32 and inductor 38 will be hereinafter referred to as the DC output-port 25 of transistor 22. Output biasing circuit 32 supplies a current $i_c$ to collector 26 and a biasing voltage $v_c$ across output-port 25.

Figure 2:
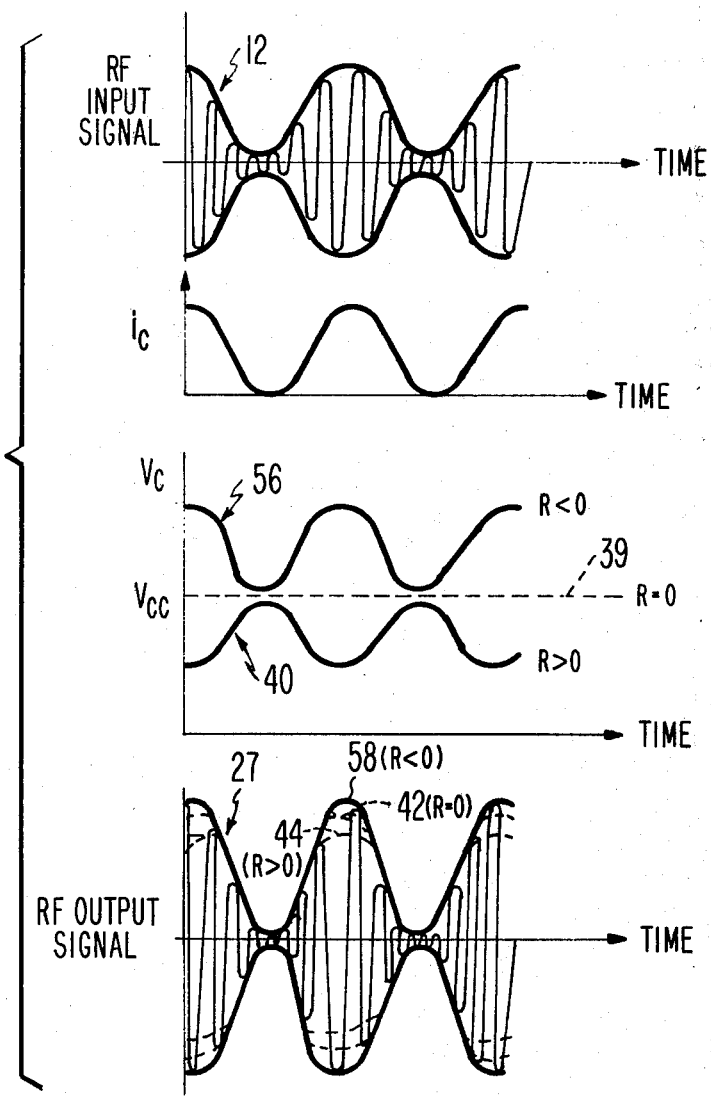
FIG. 2 illustrates various waveforms associated with a class B RF amplifier.

Referring now to FIG. 2, in conjunction with FIG. 1, the phenomenon of amplitude distortion in prior art amplifier 10 is now described. In an amplifier operating in class B mode, transistor 22 is conductive only during half of the cycle of RF input signal 12. Such a rectification process causes $i_c$ to be proportional to the amplitude of RF input signal 12. Thus, the magnitude of $i_c$ varies in accordance with the amplitude modulation of RF input signal 12. Accordingly, the voltage drop across source resistance 36, equal to $i_cR$, also varies in accordance with the amplitude modulation of RF input signal 12. The biasing voltage $v_c$, equal to $V_{cc} - (i_cR)$, thus varies inversely with the amplitude of the RF input signal 12. If output biasing circuit 32 is an ideal DC source, (R=0), $v_c$ equals a constant, $V_{cc}$, as illustrated by line 39 in FIG. 2. It is noted that even where biasing circuit 32 is an ideal battery and the voltage drop ($i_cR$) across the source resistance 36 is negligible, the amplitude range of linear operation of amplifier 10 is limited by the compression of the amplitude of output signal 27 due to saturation of transistor 22 at high amplitudes of RF input signal 12. Such compression is illustrated by portion 42 of waveform 27 in FIG. 2. A typical waveform for output biasing voltage $v_c$ with a source resistance value R greater than zero is indicated in FIG. 2 as waveform 40. When the source resistance 36 is greater than zero, the compression of the amplitude of output signal 27 becomes more pronounced, as illustrated by portion 44 of waveform 27. In such an instance the voltage drop ($i_cR$) across source resistance 36 increases in accordance with rising amplitude of input signal 12. The output biasing voltage $v_c$, viz., ($V_{cc} - i_cR$), accordingly decreases. Thus, when the amplitude of RF input signal 12 is highest and amplifier 10 is required to deliver the maximum output power, the output biasing voltage $v_c$ is lowest, thereby causing transistor 22 to more deeply saturate. Thus, in the prior art, amplitude distortion occurs for high amplitudes of RF input signal 12.

Figure 3:
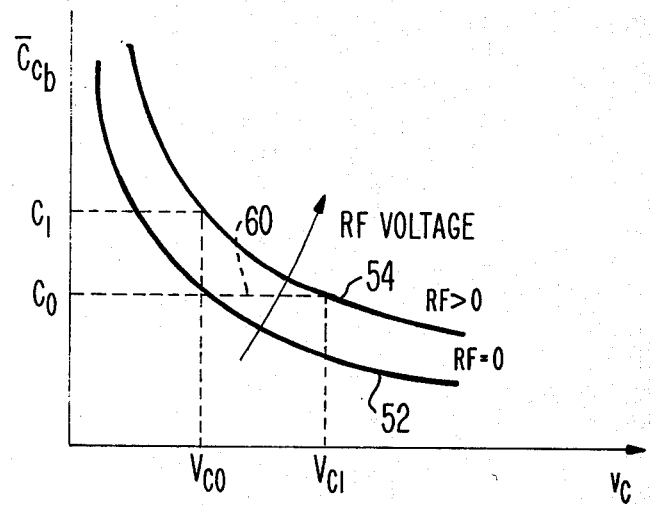
FIG. 3 is a graph of collector-base capacitance versus collector voltage.

Phase distortion in prior art amplifier 10 is now described with reference to FIGS. 1 and 3. A varactor-like parasitic capacitance, illustrated by varactor 50 in FIG. 1, exists between collector 26 and base 20 of transistor 22. Such capacitance is hereinafter termed the "output-port capacitance." The instantaneous value of the output-port capacitance, $C_{cb}$, is a nonlinear function of the voltage across collector 26 and base 20, such voltage being the sum of the output biasing voltage $v_c$ and the instantaneous amplitude of RF output signal 27. A graph of the average (over one RF cycle of signal 12) output-port capacitance $\overline{C_{cb}}$ versus output biasing voltage $v_c$ is shown in FIG. 3. Curve 52 represents the average output capacitance $\overline{C_{cb}}$ as a function of $v_c$ with no RF signal 12 applied, and, accordingly, represents the instantaneous output-port capacitance as a function of the collector-base voltage.

The average output-port capacitance $\overline{C_{cb}}$ increases in accordance with the amplitude of RF signal 12, explained as follows. When the amplitude of RF output signal 27 is significant as compared to $v_c$, the voltage across collector 26 and base 20 varies about the output bias voltage $v_c$. The instantaneous output-port capacitance $C_{cb}$ varies along curve 52 in accordance with the sum of $v_c$ and the instantaneous amplitude of signal 27. The non-linearity of curve 52 causes the average output-port capacitance $\overline{C_{cb}}$, for a given output biasing voltage, $V_{co}$, to increase with the amplitude of RF signal 12, as illustrated by curve 54. For example, with $v_c$ equal to a predetermined voltage $V_{co}$ and no RF signal 12 applied to transmitter 10, $\overline{C_{cb}}$ is equal to a value $C_o$. However, with an RF signal 12 of a predetermined maximum amplitude applied, the collector-base voltage varies about $V_{co}$, causing the average capacitance $\overline{C_{cb}}$ to increase to a value $C_1$. Such variation of the output-port capacitance $C_{cb}$ in accordance with the amplitude of RF input signal 12 causes phase distortion in output signal 27.

Saturation and voltage-dependent variable parasitic capacitance phenomenons similar to those discussed above cause amplitude and phase distortion in FET amplifiers.

Figure 4:
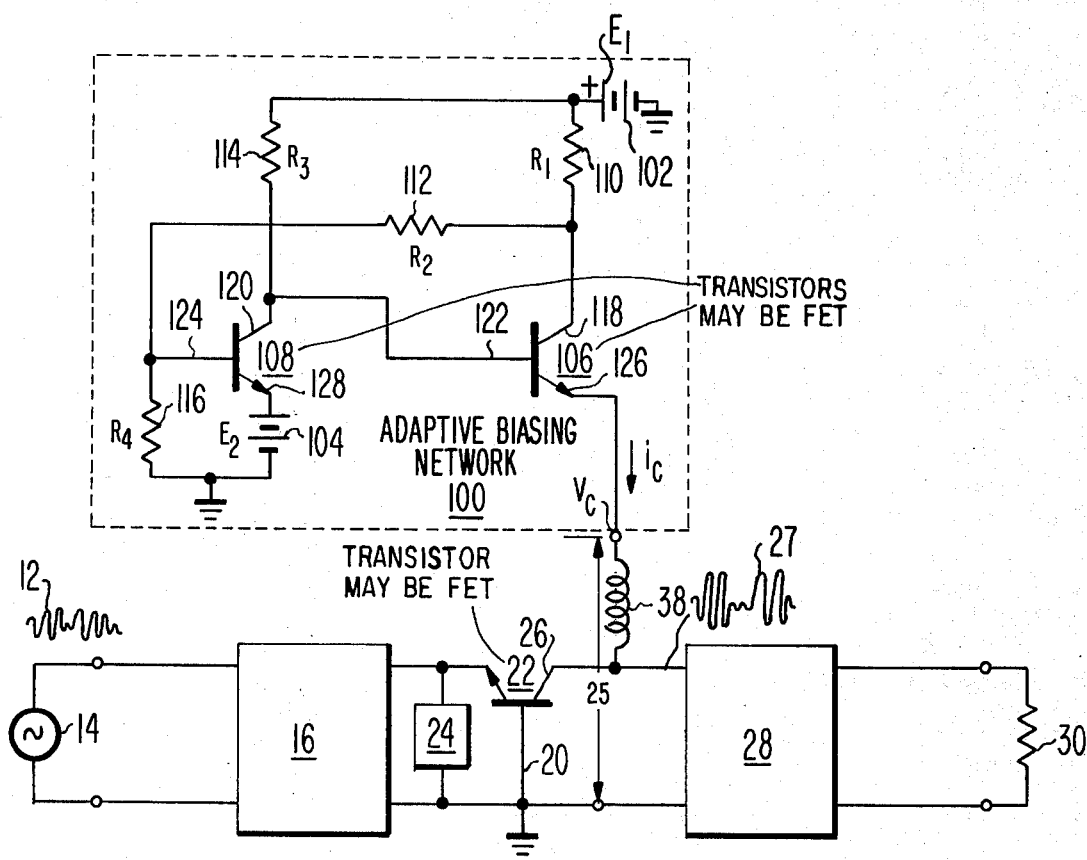
FIG. 4 is a schematic diagram of a class B RF amplifier in accordance with the present invention.

FIG. 4 depicts a high power linear amplifier in accordance with the present invention. As in prior art amplifier 10, a suitable source 14 supplies an amplitude modulated RF input signal 12 applied, through a suitable input impedance matching network 16, across the emitter and base of a transistor 22. An amplified RF output signal 27 is provided across the collector 26 and base 20 of transistor 22 and is applied, through suitable output impedance matching network 28, to a load 30. DC input biasing is provided by DC input biasing network 24. The aforementioned elements are of the same type as those elements bearing the same numerals in FIG. 1, described earlier. Output-port biasing is provided by an adaptive biasing network 100, which is connected through an RF choke 38 to collector 26 of transistor 22.

Adaptive biasing network 100 comprises: first and second voltage sources 102 and 104, respectively providing voltages $E_1$ and $E_2$; first and second transistors 106 and 108; and first, second, third and fourth resistors, 110, 112, 114, and 116, of respective values $R_1$, $R_2$, $R_3$ and $R_4$. Transistors 106 and 108 are shown in FIG. 4 as NPN transistors, respectively having collectors 118 and 120, bases 122 and 124 and emitters 126 and 128. It should be appreciated, however, that transistors 106 and 108 may be either of the NPN or PNP type transistor or field effect transistors (FETs). Resistors 110 and 114 are respectively coupled between voltage source 102 and collector 118 of transistor 106, and voltage source 102 and collector 120 of transistor 108. Resistors 112 and 116 are respectively coupled between collector 118 of transistor 106 and base 124 of transistor 108 and base 124 and ground. Voltage source 104 is coupled between emitter 128 of transistor 108 and ground. Base 122 of transistor 106 is coupled to collector 120 of transistor 108. Emitter 126 of transistor 106 is coupled through RF choke 38 to collector 26 of transistor 22, to provide $i_c$ and $v_c$.

It should be appreciated that a compensation capacitor (not shown) may be added in shunt to resistor 112. The value of such a compensation capacitor is chosen such that the time constant of the capacitor and resistor 112 is equal to the time constant of resistor 116 and the input capacitance of transistor 108. Such compensation capacitor will increase the modulation bandwidth of adaptive biasing network 100.

It should further be appreciated that transistor 22 may be arranged, as known in the art, in configurations other than the common base configuration shown in FIG. 4.

In accordance with the present invention, adaptive output biasing network 100 utilizes positive feedback to vary the output bias voltage $v_c$ in accordance with $i_c$, such that, in effect, the output biasing circuit has a negative equivalent resistance, as will be explained below. By properly choosing the value of the negative resistance, as will be explained, output signal 27 is made to be an undistorted amplification of RF input signal 12. Such an output signal 27 is illustrated by undistorted waveform portions 58 in FIG. 2.

The specific operation of adaptive biasing network 100 is as follows. An increase in $i_c$ due to an increase in the amplitude of RF input signal 12 causes the current through resistor 110 to increase. Resistors 112 and 116 operate as a voltage divider and, accordingly, the increased voltage drop across resistor 110 causes the voltage applied to base 124 to decrease. Such decrease in base (124) voltage causes a decrease in the collector (120) current through resistor 114. The decreased voltage drop across resistor 114 results in an increasing voltage applied to base 122, in turn, resulting in an increased output voltage $v_c$ at emitter 126. Thus, an increase in the amplitude of RF signal 12 results in a proportionate increase in output biasing voltage $v_c$. Accordingly, transistors 106 and 108 and resistors 110, 112, 114 and 116 provide what may be termed positive feedback, causing adaptive biasing network 100 to have, in effect, a negative equivalent resistance, where the equivalent resistance is defined, using the polarity conventions for a generator, as the ratio of the change ($\Delta V_c$) in $V_c$ in response to a given change ($\Delta i_c$) in $i_c$ to such given change $\Delta$ in $i_c$ ($\Delta i_c$).

Such negative equivalent resistance can be explained, in another manner, by applying Thevenin's theorem to adaptive biasing network 100. According to Thevenin's theorem, network 100 can be characterized as a voltage source of value $V_{co}$ (the voltage of the network for $i_c=0$) and an equivalent impedance R, viz., $$\left(\frac{\Delta V_c}{\Delta i_c}\right)$$

Network analysis of biasing network 100 shows the equivalent resistance R of network 100 to be negative. Such equivalent resistance is expressed for bipolar transistors 106 and 108 by the following equation (1).

$$R = \frac{\Delta V_c}{\Delta i_c} = -R_3 \left[\left(\frac{R_1}{R_2}\right)\beta_2 - \left(\frac{1}{\beta_1}\right)\right] \quad (1)$$

where $\beta_1$ and $\beta_2$ are respectively the common emitter current gains of transistors 106 and 108. The output voltage $V_{co}$ for $i_c=0$ may be expressed as follows:

$$V_{co} = E_1 - \beta_2 R_3 \left[\left(\frac{E_1}{R_2}\right) - \left(\frac{(R_2+R_4)}{(R_2 R_4)}(E_2+V_{b2})\right)\right] - V_{b1} \quad (2)$$

where $V_{b1}$ and $V_{b2}$ are respectively the base to emitter voltages of transistors 106 and 108. For silicon transistors $V_{b1}$ and $V_{b2}$ are typically equal to 0.75 volts.

A similar equivalent circuit can be derived for an adaptive biasing network 100 utilizing FET's for transistors 106 and 108. The equivalent resistance R for $i_c=0$, may be expressed as follows:

$$R = \left[-gm_2\left(\frac{(R_1R_3R_4)}{(R_2+R_4)}\right)\right] + \frac{1}{gm_1} \quad (3)$$

where $gm_1$ and $gm_2$ are respectively the FET transconductances of transistors 106 and 108.

Similarly, the output voltage, $V_{co}$ for $i_c=0$ may be expressed:

$$V_{co} = E_1 \left[1 - \left(gm_2\frac{(R_3R_4)}{(R_2+R_4)}\right)\right] + gm_2R_3(E_2+V_{p_2}) - V_{p_1} \quad (4)$$

where $V_{p1}$ and $V_{p2}$ are respectively the pinch-off voltages of FET's 106 and 108.

A negative equivalent resistance in output biasing network 100 operates to eliminate substantially amplitude and phase distortion in output signal 27. When output biasing network 100 has such a negative source resistance, $v_c$ varies directly in accordance with the amplitude of the RF input signal 12, as illustrated in FIG. 2 by waveform 56. The output bias voltage $v_c$, and hence the DC input power to transistor 22, is thus high at the amplitude peaks of RF input signal 12 and tends to compensate for the inherent saturation of transistor 22, eliminating thereby amplitude distortion.

Phase distortion is substantially eliminated by varying $v_c$ in accordance with $i_c$ to maintain thereby a constant average output-port capacitance $\overline{C_{cb}}$ over the range of amplitudes of RF input signal 12. Referring again to FIG. 3, $v_c$ is increased from a given value $V_{co}$ to a predetermined value $V_{c1}$ in accordance with increases in the amplitude of RF input signal 12 due to the negative equivalent resistance of biasing network 100. The average (over one RF cycle) output-port capacitance $\overline{C_{cb}}$ is made, thus, to remain substantially constant, as shown by line 60 in FIG. 3. The phase characteristic of the amplifier is thereby linearized.

It is noted that the value of negative resistance that effects the lowest amplitude distortion is, in general, different from the value of negative resistance that effects the lowest phase distortion. Thus, a compromise for optimum amplifier performance is obtained either by measurement, as will be explained, or by computing the total intermodulation signal amplitudes from the amplitude and phase distortion characteristics of the amplifier for various equivalent resistance (R) values, and therefrom selecting the optimum value of negative resistance. With respect to such computation reference is made to Proceedings of the IEEE, Vol. 59, No. 2, Feb. 1971, "Effects of Intermodulation, AM-PM Conversion, and Additive Noise in Multicarrier TWT Systems" by Osamu Shimbo.

With respect to optimization by measurement, it should be noted that the value of R is independent of $E_1$, $E_2$ and $R_4$ for bipolar transistors and $E_1$ and $E_2$ for FET's. Thus, R can be chosen to optimize, for example, the gain linearity and any of such independent quantities can be used to control the output voltage $V_{co}$, without affecting R, to effect thereby optimization of the phase linearity of the RF amplifier. Accordingly, adaptive biasing network 100 can be optimized experimentally by varying one of such independent quantities until optimum intermodulation distortion is measured with a modulated RF input signal 12 applied.

A linear class B RF amplifier such as shown in FIG. 4 has been implemented, wherein $E_1$ and $E_2$ were respectively 34 volts and 9.89 volts, $R_1=10.5$ K ohms, $R_2=4$ K ohms, $R_3=315$ ohms, $R_4=212$ K ohms, and RCA TA 8922 NPN transistors were utilized for transistors 106 and 108.

Typical values for an adaptive biasing network 100 utilizing metal Schottky barrier FETS (MESFETS) having pinch off voltages ($V_p$) of $-3.8$ volts and transconductance (gm) of 72 milliamperes per volt, are as follows: $R_1=10.5$ ohms, $R_2=5.8$ K ohms, $R_3=540$ ohms, $R_4=384$ ohms, $E_1=34$ volts and $E_2=5.6$ volts.

What is claimed is:

1. A linear amplifier for a radio frequency (RF) input signal, said RF input signal being amplitude modulated, said amplifier being of the type having a DC input-port and a DC output-port and including a first transistor having first, second and third electrodes; first biasing means connected across said input-port for providing a first biasing voltage across said first and second electrodes, and second biasing means, connected across said output-port, for providing a second biasing voltage across said first and third electrodes and a current through said third electrode, said third electrode current varying in accordance with the amplitude of said RF input signal, said amplifier generating an output signal across said first and third electrodes; wherein the improvement comprises:

said second biasing means including positive feedback means for varying said second bias voltage in accordance with said third electrode current;

whereby phase and amplitude distortion in said output signal are substantially reduced.

2. The amplifier of claim 1 wherein said second biasing means comprises: first and second voltage sources; a second transistor having fourth, fifth and sixth electrodes; a third transistor having seventh, eighth and ninth electrodes; and first, second, third and fourth resistors, each having two terminals;

said first resistor being connected at one terminal to said first voltage source and at the other terminal to said sixth electrode;

said second resistor being connected at one terminal to said sixth electrode and at the other terminal to said seventh electrode;

said third resistor being connected between said first voltage source and said ninth electrode;

said ninth electrode also being coupled to said fourth electrode;

said fourth resistor being connected at one terminal to said seventh electrode; and coupled at the other terminal to said first electrode;

said second voltage source being coupled between said eighth electrode and said first electrode;

said fifth electrode being coupled to said third electrode.

3. The amplifier of claim 2 wherein said second and third transistors are bipolar transistors and respectively have predetermined common emitter gains $\beta_1$ and $\beta_2$ and said first, second and third resistors have the respective values $R_1$, $R_2$ and $R_3$, wherein further:

the quantity defined by $$-R_3 \left( \frac{R_1}{R_2} \beta_2 - \frac{1}{\beta_1} \right)$$

is equal to a predetermined desired ratio of variation in said second bias voltage to a given change in said third electrode current.

4. The amplifier of claim 2 wherein said second and third transistors are field effect transistors and respectively have predetermined transconductances $gm_1$ and $gm_2$ and said first, second, third and fourth resistors have the respective values $R_1$, $R_2$, $R_3$ and $R_4$, wherein further:

the quantity defined by $$-gm_2 \left[ \frac{(R_1 R_3 R_4)}{(R_2 + R_4)} \right] + \frac{1}{gm_1}$$

is equal to a predetermined desired ratio of variation in said second bias voltage to a given change in said third electrode current.

* * * * *